United States Patent [19]
Ferrell

[11] Patent Number: 5,909,741
[45] Date of Patent: Jun. 8, 1999

[54] CHEMICAL BATH APPARATUS

[76] Inventor: Gary W. Ferrell, 608 Terrace Ave., Half Moon Bay, Calif. 94019

[21] Appl. No.: 08/879,576

[22] Filed: Jun. 20, 1997

[51] Int. Cl.$^6$ ..................................................... B08B 3/12
[52] U.S. Cl. ............................. 134/1; 134/1.3; 134/184; 134/201; 134/902
[58] Field of Search ............................. 134/1, 1.3, 902, 134/201, 184, 147, 148

[56] References Cited

U.S. PATENT DOCUMENTS

| | | | |
|---|---|---|---|
| 5,226,437 | 7/1993 | Kamikawa et al. | 134/902 X |
| 5,370,142 | 12/1994 | Nishi et al. | 134/902 X |
| 5,409,594 | 4/1995 | Al-Jiboory et al. | 134/1 X |
| 5,421,905 | 6/1995 | Ueno et al. | 134/25.4 |
| 5,462,604 | 10/1995 | Shibano et al. | 134/1 |
| 5,503,171 | 4/1996 | Yokomizo et al. | 134/182 |
| 5,505,785 | 4/1996 | Ferrell | 134/1 |
| 5,534,076 | 7/1996 | Bran | 134/1 |
| 5,584,401 | 12/1996 | Yoshida | 134/902 X |
| 5,625,249 | 4/1997 | Grant | 134/184 X |

OTHER PUBLICATIONS

Handbook of Semiconductor Wafer Technology, Noyes Publications, pp. 22, 23, 141 and 142, 1993.

*Primary Examiner*—Lyle A. Alexander
*Assistant Examiner*—Alexander Markoff
*Attorney, Agent, or Firm*—John Schipper

[57] ABSTRACT

Method and apparatus for processing a workpiece in a chemical bath liquid contained in a liquid container. The liquid container is fabricated from a material such as poly-etheretherketone (PEEK), poly-amide-imide (PAI) or polyphenylene sulfide (PPS). A vibration generator is positioned on each of one or more container walls to introduce vibrations with a selected frequency (20–750 kHz) through the container wall(s) and into the chemical bath liquid. Two or more vibration generators may introduce vibrations with different frequencies into the chemical bath liquid and at different angles. The chemical bath liquid may be an acid such as HCl, $H_2SO_4$, $HNO_3$, $H_2PO_3$ and HF, or may be an oxidizer or base such as $NH_4OH$ and $H_2O_2$. The chemical bath may be used to process semiconductor wafers and circuits, printed circuit boards, optical components and similar workpieces.

10 Claims, 2 Drawing Sheets

CHEMICAL BATH APPARATUS

FIELD OF THE INVENTION

This invention relates to chemical bath apparatus used for cleaning substances from surfaces.

BACKGROUND OF THE INVENTION

Chemical baths used for cleaning surfaces of materials such as metals and semiconductors are necessarily low pH or high pH liquids that are often corrosive and highly reactive with many of the materials used to form the housing for the baths. Use of such chemical bath liquids usually requires that the bath housing be constructed of a material that is relatively inert to, or that resists chemical reaction with, a chemical bath liquid in a static bath and, preferably, in a changing environment in which vibrations or waves are introduced and maintained in the liquid. A material such as stainless steel or aluminum will promptly begin to react with and corrode in such a chemical bath liquid, and the life of such a solid material as part of the bath housing is therefore limited. Further, the ability of a conventional bath housing material to transmit or re-radiate vibrations that are intentionally introduced at the bath housing, for transmission into and through the chemical bath liquid, is often limited.

A method of electrically bonding electrical conductors to materials such as polyetheretherketone ("PEEK") is disclosed by Felix et at in U.S. Pat. No. 4,871,412.

Processes for forming high temperature, solvent-resistant, creep-resistant and/or moisture-resistant articles from polymeric materials such as PEEK is disclosed in U.S. Pat. No. 5,057,600, issued to Beck et at, in U.S. Pat. No. 5,419,208, issued to Schick, in U.S. Pat. No. 5,433,530, issued to Waskdewicz, in U.S. Pat. No. 5,454,693, issued to Aubry et at, in U.S. Pat. No. 5,455,201, issued to Gotoh et al, in U.S. Pat. No. 5,462,408, issued to Coffy, in U.S. Pat. No. 5,478,372, issued to Stark, in U.S. Pat. No. 5,521,000, issued to Owens, and in U.S. Pat. No. 5,549,276, issued to Pittman et al. Processing for a composite including polyphenylene sulfide ("PPS") is disclosed by Roberts et al in U.S. Pat. No. 5,583,583.

The inventions disclosed in these patents take advantage of the relative inertness of articles made of materials such as PEEK, poly-amide-imide ("PAI") and PPS in relatively static environments in which exposure to chemicals, to high temperatures, to high stresses and to similar conditions is more-or-less unchanging and predictable. These predictable and unchanging conditions are not present in a semiconductor wafer chemical bath in which the wafers are exposed to a sequence of high pH and low pH chemicals and to intermittent radiation at frequencies of tens to hundreds of kilohertz.

What is needed is a chemical bath housing material that (1) resists chemical breakdown, such as corrosion or dissociation, by a low pH and/or high pH chemical bath liquid to which the housing material is exposed and (2) permits re-radiation into the chemical bath liquid of vibrations in a frequency band including at least the range 20–750 kHz that are introduced intermittently into the chemical bath without substantial degradation of the definition or other characteristics of the vibrations.

SUMMARY OF THE INVENTION

These needs are met by the invention, which provides chemical bath housing apparatus fabricated from a selected polymer material, such as polyetheretherketone ("PEEK") or poly-amide-imide ("PAI") or polyphenylene sulfide ("PPS"), polymeric materials that are not permanently damaged or altered by modest exposure to the chemical mixtures often used in chemical baths for cleaning metals and semiconductors. The PEEK, PAI or PPS material is used to fabricate a chemical bath housing that is substantially unreactive when exposed to many low pH or high pH liquids and that permits introduction of vibrations, in a frequency band that ranges from 20 kHz up to at least 750 kHz, into the chemical bath liquid contained in the housing, by positioning one or more transducers at an inside wall or an outside wall of the housing.

DESCRIPTION OF BEST MODE OF THE INVENTION

Figure 1:
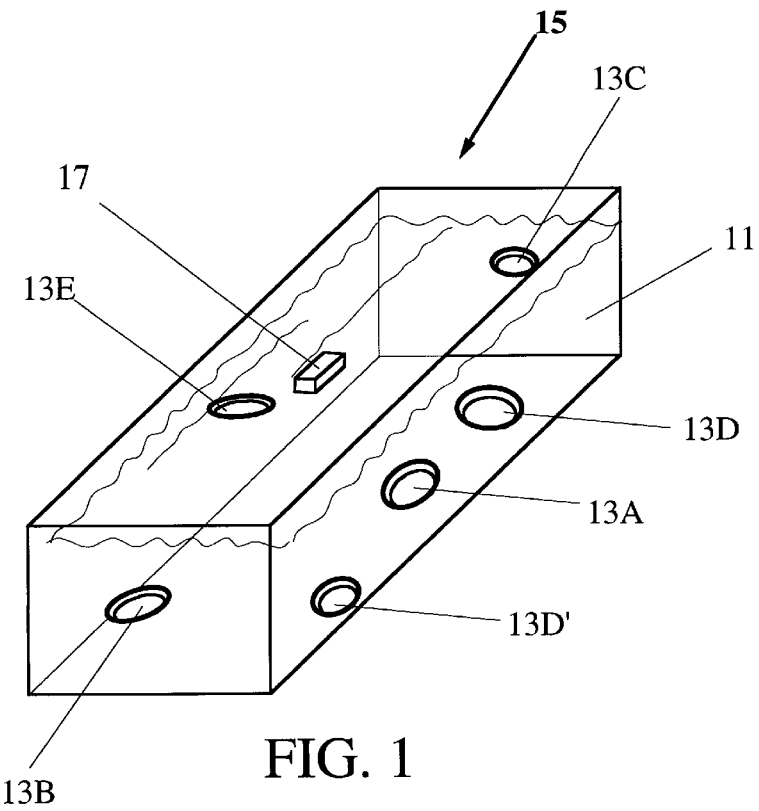
FIG. 1 illustrates a chemical bath housing fabricated using a selected polymeric material according to the invention.

The invention uses a material, drawn from a selected group of polymeric materials, to fabricate a chemical bath housing 11 and to provide sites for or more transducers 13A, 13B, 13C, 13D, 13E attached to the housing to introduce vibrations V with controllable vibration parameters into a chemical bath liquid 15 contained in the housing, as illustrated in FIG. 1. The selected group of materials includes: (1) polyetheretherketone ("PEEK"), an optionally partly glass-filled, semi-crystalline polymeric solid whose polymeric unit has approximately the chemical structure

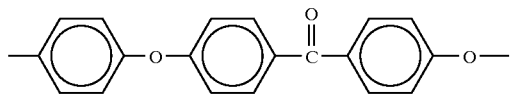

(2) a poly-amide-imide ("PAI"), whose chemical structure is not available, and (3) polyphenylene sulfide ("PPS"), whose polymeric unit has the approximate chemical structure

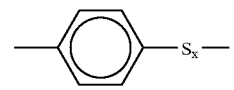

PEEK has a continuous use temperature of at least $T=480°$ C., a tensile modulus of about $6 \times 10^5$ psi and $1 \times 10^6$ psi for the pure polymer and for a 30 percent glass-filled version, respectively. PAI is also available in two versions, with a continuous use temperature of at least $T=475°$ C. and tensile modui of around $6 \times 10^5$ psi and $9 \times 10^5$ psi. A third material, PPS, behaves similarly but has a different chemical composition and structure, which includes sulfur. A chemical bath housing constructed from PEEK has been used for a plurality of short term chemical baths (30–60 minutes each) at temperatures up to about $T=400°$ C. with no chemical breakdown detectable by visual inspection. Table 1, taken from spec. sheets provided by Polymer Corporation of Reading, Pa., sets forth other relevant material parameters for PEEK, for PAI and for PPS.

TABLE 1

Material Parameters for PEEK and PAI and PPS

|  | PEEK | PEEK (30% glass) | PAI | PPS |
|---|---|---|---|---|
| Spec grav | 1.32 | 1.54 | 1.41 | 1.35 |
| Tensile mod (psi) | $6 \times 10^5$ | $1 \times 10^6$ | $6 \times 10^5$ psi | $5 \times 10^5$ psi |
| Shear strength (psi) | 9,000 | 14,000 | 16,000 | 8,000 |
| Lin therm expan | $2.6 \times 10^{-5}$ | $1.2 \times 10^{-5}$ | $1.7 \times 10^{-5}$ | $2.8 \times 10^{-5}$ |
| Glass transition | N.A. | N.A. | 527° C. | N.A. |
| Melt point | 644° C. | 644° C. | N.A. | 540° C. |
| Contin serv temp | 480° C. | 480° C. | 480° C. | 425° C. |

PEEK, PAI and PPS are found to be resistant, to varying extents, to breakdown by acids such as HCl, $H_2SO_4$, $HNO_3$, $H_2PO_3$ and HF and by bases and oxidizers such as $NH_4OH$ and $H_2O_2$. A partly glass-filled version of PEEK (30%) or PPS (40%) is sensitive to exposure to HF acid, and possibly to exposure to $H_2PO_3$ acid, but a non-glass-filled PEEK or PPS has only modest sensitivity to exposure to either of these acids and can be used in most of the situations where a glass-filled PEEK or PPS material can be used. A chemical bath housing with a volume of between 10 and 200 liters, or larger if desired, constructed of PEEK, of PAI or of PPS, preferably has a housing wall thickness in a range h≈0.5–2 cm. A higher housing wall thickness can be used but is not usually needed for a chemical bath. A smaller housing wall thickness may undergo unacceptable local wall distortions when a transducer is used to introduce vibrations in a liquid contained by the housing.

Figure 2:
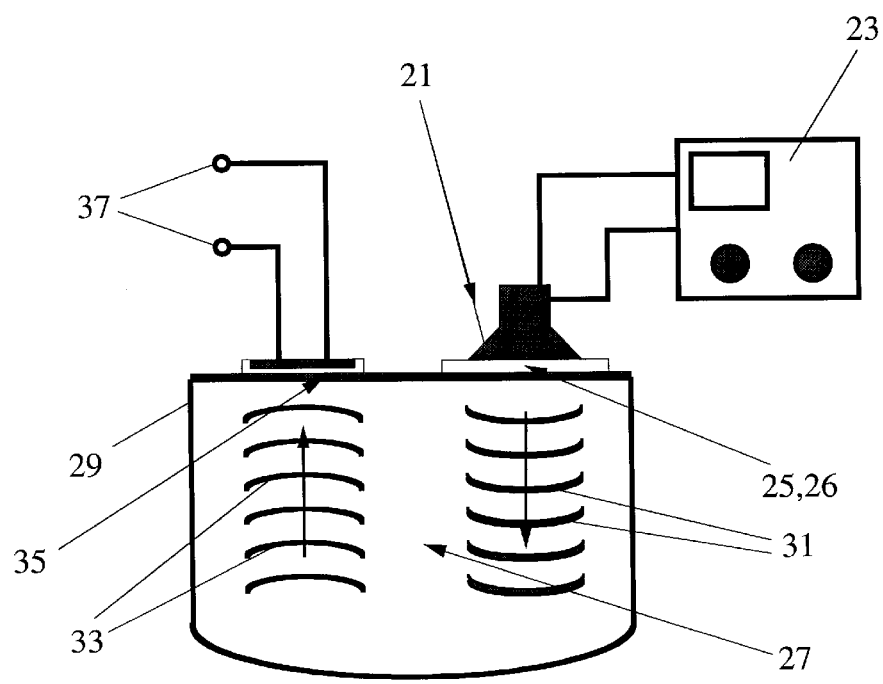
FIG. 2 illustrates vibration tests performed on PEEK and stainless steel sheets.
Figures 3A, 3B:
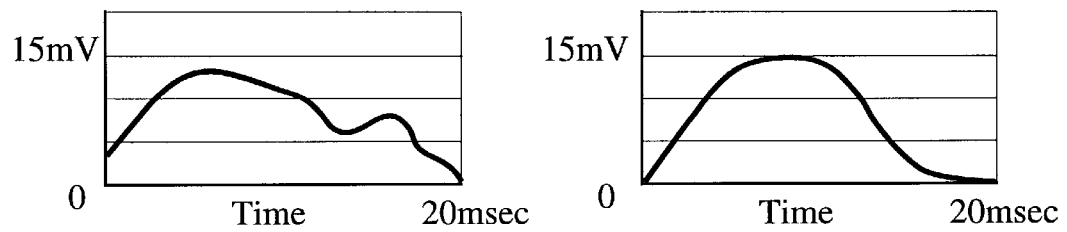
FIGS. 3A and 3B are graphical views of some of the results of these tests for PEEK and for stainless steel, respectively.

A wall or sheet of glass-filled PEEK has been compared with a stainless steel sheet for signal attenuation, as illustrated in FIG. 2. A first ultrasonic transducer 21, driven by an ultrasonic generator 23, was attached to the outside surface of a PEEK sheet 25 of thickness 0.5 cm, serving as an acoustic radiator. Vibrations at frequencies drawn from a range of 20, 40, 72, 104 and 136 kHz were transmitted through the PEEK sheet 21 and through a selected liquid 27 (de-ionized water), contiguous with the PEEK sheet and contained within a housing 29. The vibrations introduced at the first end of the container 29 produced a first sequence of waves 31 that moved toward a second end of the container. The waves were reflected at the second end of the container 29 and returned toward the first end of the container as a second set of waves 33. The vibrations associated with this second set of waves were sensed by a second ultrasonic transducer 35, and a voltage-time graph was provided by two leads 37 attached to the second transducer and to an oscilloscope (not shown). For the sheet of PEEK 25, the graph shown in FIG. 3A was produced, for a representative excitation frequency of 40 kHz. Where the sheet of PEEK was replaced by a sheet of 0.21 cm thick stainless steel and the experiment was repeated, the graph shown in FIG. 3B was produced.

The amplitudes of signals transmitted through the sheet of PEEK with a thickness h≈0.5 cm are approximately 70–80 percent of the amplitudes of signals at the same frequencies transmitted through a sheet of stainless steel having a thickness h≈0.21 cm., and the signal definition for signal transmission through PEEK was satisfactory. These tests indicate that a housing constructed with container walls of PEEK is a satisfactory substitute for a housing constructed of stainless steel, with the added advantage that the PEEK or poly-amide-imide or PPS walls will not react chemically with the usual chemical baths including acids such as HCl, $H_2SO_4$, $HNO_3$, $H_2PO_3$ and HF, nor with bases and oxidizers such as $NH_4OH$ and $H_2O_2$. PAI and/or PPS, because of its similar response to various environmental conditions such as those indicated in Table 1, should behave similarly to PEEK, with reduced permissible ranges for some of the environmental parameters such as glass transition temperature and melt point.

Figure 4:
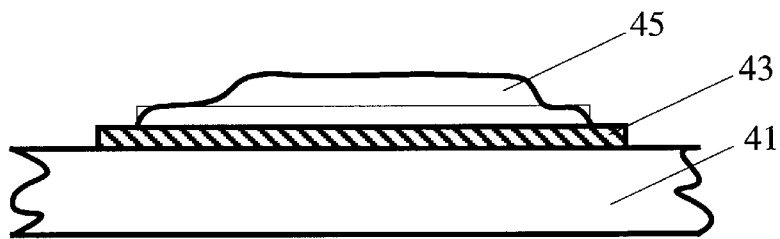
FIG. 4 illustrates a suitable configuration for attaching a transducer to a chemical bath housing wall.

Transfer of vibrations from a transducer through a PEEK housing wall, into a chemical bath liquid and to a workpiece 17 (FIG. 1) to be cleaned or otherwise processed has been successfully achieved at frequencies in a range of 20–136 kHz, with an acceptably small loss of vibration signal definition at each frequency tested. However, bonding of a transducer to bare PEEK material or poly-amide-imide material can be problematical. The invention includes a method to achieve reliable bonding and is illustrated in one embodiment in FIG. 4. With a sheet 41 of PEEK (or PAI or PPS) material of thickness h serving as a substrate, a glass mat 43, partially or fully saturated with epoxy and having a thickness preferably in a range h(glass)≈1–5 mm, is laid down on the PEEK sheet. A transducer 45 is then pressed into the glass mat 43, preferably with a force per unit area in the range of 10–100 psi (preferably about 25 psi), and the combination of substrate 41, glass mat 43 and transducer 45 is baked at a temperature T≈150–300° C. for a time interval of Δt≈180 minutes. The transducer 45 may be located on the inside wall of the housing or PEEK sheet 41, in contact with the chemical bath liquid, if the transducer itself is sufficiently well protected against the chemical bath liquid. Preferably, the transducer 45 is located on the outside wall of the housing 41 so that special protection of the transducer against the chemical bath liquid is not required.

One or a plurality of transducers can be positioned on one or more walls of the housing, according to a desired radiation or vibration pattern to be produced within the chemical bath liquid. One suitable pattern, illustrated in FIG. 1, for transducer location is a single transducer 13A (or 13E) positioned approximately at the center of a bottom wall (or a side wall) that is part of the chemical bath housing 11. A second suitable pattern uses the transducer 13A (or 13E) plus two transducers 13B and 13C positioned approximately at the centers on two opposed side walls of the housing 11. A third suitable pattern uses the transducers 13A, 13B and 13C plus two transducers 13D and 13E positioned approximately at the centers of two additional opposed side walls of the housing 11.

Figure 5:
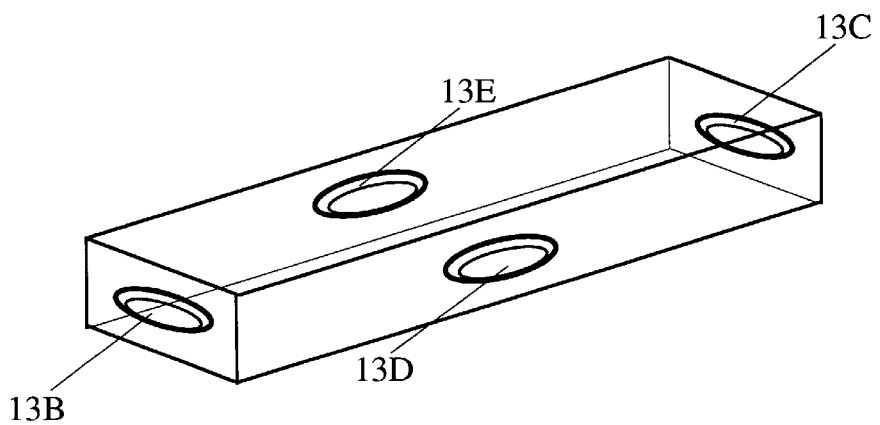
FIG. 5 illustrates a multi-frequency embodiment of the invention.

Preferably, if a plurality of transducers is used, all transducers are driven at the same frequency, which may be anywhere in the range 20–750 kHz, or possibly higher. However, in special situations, it may be preferable to drive the bottom wall transducer 13A (or a side wall transducer 13E) at a first frequency f1 and to drive side wall transducers 13B, 13C, 13D and/or 13E at a second (different) frequency f2, if some of the residues to be removed from semiconductor or optical wafers or from printed circuit boards in the chemical bath require special treatment. This might occur, for example, if some of the residues are located within long, narrow troughs in wafer surfaces, as illustrated in FIG. 5. For example, the first frequency might be chosen in the range f1≈20–104 kHz and the second frequency might be chosen in the range 72–750 kHz.

I claim:

1. A method of introducing controlled vibrations into a liquid, the method comprising the steps of:

providing a liquid container, containing a selected liquid and having at least three container walls, with each of a first container wall and a second container wall being a sheet having at least two exposed and opposing faces, having a selected thickness, and being made of a selected material drawn from the group consisting of polyetheretherketone, poly-amide-imide and polyphenylene sulfide; and introducing vibrations at a first selected frequency into the selected liquid through the first container wall;

introducing second vibrations at a second selected frequency into the liquid at the second container wall in a time interval that overlaps a time interval during which the first vibrations are introduced, where the second selected frequency differs from the first selected frequency and the second container wall is oriented relative to the first container wall so that the second vibrations are oriented at a selected angle that is substantially greater than zero, relative to the orientation of the first vibrations.

2. The method of claim 1, further comprising the step of selecting at least one of said first vibration generator and said second vibration generator to produce vibrations with at least one of said first selected frequency and said second selected frequency in the range 20 kHz–750 kHz.

3. The method of claim 1, further comprising the steps of selecting said first frequency in the range 20–104 kHz and selecting said second frequency in the range 72–750 kHz.

4. The method of claim 1, further comprising the step of choosing said selected liquid to include a chemical bath component drawn from the group of chemical bath components consisting of HCl, $H_2SO_4$, $HNO_3$, $H_2PO_3$, HF, $NH_4OH$ and $H_2O_2$.

5. Chemical bath apparatus for processing a workpiece, the apparatus comprising:

a liquid container, adapted to contain a chemical bath liquid and having at least three container walls, with each of a first container wall and a second container wall being a sheet having at least two exposed and opposing faces, having a selected thickness, and being made of a selected material drawn from the group consisting of polyetheretherketone, poly-amide-imide and polyphenylene sulfide; and a first vibration generator positioned against the first container wall so that, when the first vibration generator is activated, vibrations including a first selected frequency are produced by the first vibration generator and pass into the chemical bath liquid contained in the container at the first container wall; and a second vibration generator positioned against the second container wall so that, when the second vibration generator is activated, vibrations including a second selected frequency are produced by the second vibration generator and pass into the chemical bath liquid at the second container wall in a time interval that overlaps a time interval during which the first vibrations are produced, where the second selected frequency differs from said first selected frequency and the second container wall is oriented relative to the first container wall so that the second vibrations are oriented at a selected angle that is substantially greater than zero, relative to the orientation of the first vibrations.

6. The apparatus of claim 5, wherein at least one of said first vibration generator and said second vibration generator produces vibrations with at least one frequency in the range 20 kHz–750 kHz.

7. The apparatus of claim 5, wherein said first frequency is selected in the range 20–104 kHz and said second frequency is selected in the range 72–750 kHz.

8. The apparatus of claim 5, further comprising a chemical bath liquid, contained in said liquid container and including a chemical bath component drawn from the class of chemical bath components consisting of HCl, $H_2SO_4$, $HNO_3$, $H_2PO_3$, HF, $NH_4OH$ and $H_2O_2$.

9. The method of claim 1, further comprising the step of selecting said angle between said orientations of said first vibrations and said second vibrations to be about 90°.

10. The apparatus of claim 5, wherein said angle between said orientations of said first vibrations and said second vibrations is selected to be about 90°.

* * * * *